(12) United States Patent
Louis

(10) Patent No.: US 7,148,746 B2
(45) Date of Patent: Dec. 12, 2006

(54) HIGH EFFICIENCY AMPLIFIER

(75) Inventor: Edward V. Louis, Saint Charles, IL (US)

(73) Assignee: Andrew Corporation, Orland Park, IL (US)

( * ) Notice: Subject to any disclaimer, the term of this patent is extended or adjusted under 35 U.S.C. 154(b) by 34 days.

(21) Appl. No.: 10/973,360

(22) Filed: Oct. 26, 2004

(65) Prior Publication Data

US 2006/0087371 A1    Apr. 27, 2006

(51) Int. Cl.
*H03F 3/68* (2006.01)
(52) U.S. Cl. .................................... 330/124 R
(58) Field of Classification Search ............... 330/280, 330/84
See application file for complete search history.

(56) References Cited

U.S. PATENT DOCUMENTS

| | | | |
|---|---|---|---|
| 4,439,744 A | 3/1984 | Kumar et al. ............ 330/285 |
| 4,631,492 A | 12/1986 | Magarshack et al. ....... 330/277 |
| 4,677,393 A | 6/1987 | Sharma .................. 330/286 |
| 4,701,716 A | 10/1987 | Poole et al. | |
| 4,717,884 A | 1/1988 | Mitzlaff ................ 330/251 |
| 5,025,225 A * | 6/1991 | Tajima et al. ........... 330/124 D |
| 5,083,094 A | 1/1992 | Forsberg ............... 330/124 R |
| 5,101,171 A | 3/1992 | Redmond et al. | |
| 5,136,256 A | 8/1992 | Salzberg ................ 330/53 |
| 5,222,246 A | 6/1993 | Wolkstein et al. | |
| 5,389,890 A | 2/1995 | Burrage ................ 330/124 R |
| 5,420,541 A | 5/1995 | Upton et al. ............ 330/286 |
| 5,430,411 A | 7/1995 | Boulic ................. 330/284 |
| 5,543,751 A | 8/1996 | Stedman et al. .......... 330/124 D |
| 5,663,682 A | 9/1997 | Meline et al. ........... 330/124 R |
| 5,757,229 A | 5/1998 | Mitzlaff ............... 330/124 R |
| 5,786,727 A | 7/1998 | Sigmon ................ 330/124 R |
| 5,896,065 A | 4/1999 | Myer .................. 330/286 |
| 5,999,046 A | 12/1999 | Kotzamanis ............ 330/124 R |
| 6,094,097 A | 7/2000 | Ke .................... 330/124 R |
| 6,262,629 B1 | 7/2001 | Stengel et al. .......... 330/124 R |
| 6,320,462 B1 | 11/2001 | Alley .................. 330/124 R |
| 6,359,506 B1 | 3/2002 | Camp, Jr. et al. ....... 330/124 R |
| 6,384,680 B1 | 5/2002 | Takei et al. ............ 330/124 R |
| 6,396,349 B1 | 5/2002 | Takei et al. ............ 330/286 |

(Continued)

FOREIGN PATENT DOCUMENTS

EP    0731559    9/1996

(Continued)

OTHER PUBLICATIONS

Hayt, Jr., *Engineering Electromagnetics*, MdGraw Hill Book Company, 1981, p. 449.

(Continued)

*Primary Examiner*—Benny Lee
*Assistant Examiner*—Alan Wong
(74) *Attorney, Agent, or Firm*—Wood, Herron & Evans, LLP

(57) ABSTRACT

An amplifier includes a main amplifier circuit with an input and output. At least one auxiliary amplifier circuit has an input and output, and is selectively operable to operate in combination with the main amplifier circuit. A signal combining network is coupled with outputs of the main amplifier circuit and auxiliary amplifier circuit and is operable to combine amplifier circuit output signals at an output port. The main and auxiliary amplifier circuits operate in an operational frequency band, and a delay element is coupled to the input of the auxiliary amplifier to introduce a delay to that input that is configured for introducing a delay that is an integer multiple of a wavelength at a frequency within the operational frequency band.

25 Claims, 2 Drawing Sheets

U.S. PATENT DOCUMENTS

| | | |
|---|---|---|
| 6,617,929 B1 | 9/2003 | Kim et al. .................. 330/295 |
| 6,624,694 B1 | 9/2003 | Ma et al. ..................... 330/126 |
| 6,639,463 B1 | 10/2003 | Ghanadan et al. ...... 330/124 R |
| 6,639,464 B1 | 10/2003 | Hellberg ................. 330/124 R |
| 2001/0019289 A1 | 9/2001 | Takei et al. |
| 2002/0186078 A1 | 12/2002 | Kobayashi |
| 2004/0189381 A1 | 9/2004 | Louis |

FOREIGN PATENT DOCUMENTS

| | | |
|---|---|---|
| FR | 2 525 834 | 10/1983 |
| JP | 2002043857 | 2/2002 |
| WO | WO96/04710 | 2/1996 |
| WO | WO99/17443 | 4/1999 |
| WO | WO 03/065599 | 8/2003 |

OTHER PUBLICATIONS

IBM Technical Disclosure Bulletin, *Transistor Audio Amplifier*, Apr. 1960.

Karmel et al. ,*Introduction to Electromagnetic and Microwave Engineering*, John Wiley & Sons, Inc. 1998, pp. 344-345.

European Search Report dated Feb. 16, 2006.

\* cited by examiner

HIGH EFFICIENCY AMPLIFIER

FIELD OF THE INVENTION

The present invention relates generally to RF amplifiers, such as those used for wireless communications, and more specifically to RF amplifiers for handling significant peak-to-average ratio power applications.

BACKGROUND

RF amplifiers are utilized for a variety of applications in wireless communication systems, such as to amplify or transmit a downlink signal at a base station. As a result, the amplifiers must be able to handle the power requirements associated with such wireless communication systems. Particularly, amplifiers used for applications having high peak-to-average signal ratios must be able to handle or deliver significant peak power levels above their normal or average load. For example, in order to amplify a signal with a 10 dB peak-to-average ratio, while creating a minimal amount of nonlinear distortion, an amplifier must be capable of delivering around 200 watts of power to generate an output signal with an average power of 20 watts.

Generally, the transistors used for the amplification in RF amplifiers actually run most efficiently when they are outputting close to their maximum power capability, or are operating in a saturated mode. However, the closer to saturation an amplifier is operated, the greater the amount of nonlinear distortion it outputs. Therefore, it has become standard practice to decrease or "back off" the amplifier power output until the nonlinear distortion is at an acceptable level. As a result, for handling high peak-to-average signal ratio applications in an amplifier, several amplification devices are usually operated together, and the multiple amplification devices have their outputs combined. In such an amplifier, the devices or sub-amplifiers are operated inefficiently most of the time at low power in order to be able to deliver, somewhat more efficiently, the maximum power for the relatively short period of time when the high peaks in the signal are to be amplified.

Apparatuses and techniques have been developed to improve linearity for both low level and high level input signal operation in order to more efficiently deliver the desired power requirements for certain wireless communication applications. One particular apparatus is the Doherty amplifier, which improves amplifier efficiency by effectively reducing the amplifier's saturated power level when the signal level is low, yet quickly ramping up to full power capability when the signal peaks demand it. A basic Doherty amplifier design is shown in FIG. 1, and consists of an input splitter 24, carrier amplifier 20, peaking amplifier 22 and output combiner/impedance transforming network 26.

At low input signal levels the peaking amplifier is essentially turned off, not contributing to the output. The Doherty amplifier dynamically adjusts to handle the low input signal level. More specifically, with low input signal levels, the action of the output combiner/impedance transforming network 26 causes a load to be present at the carrier amplifier 20 output that causes it to operate more efficiently at the low signal levels. However, the modified load at the carrier amplifier output results in an increase in signal delay through the carrier amplifier 20 from normal operation.

As the input signal level increases, the peaking amplifier 22 contributes more to the overall output signal. At the same time, the output combiner/impedance transforming network 26 causes the carrier amplifier load to gradually change to a level that allows the carrier amplifier to output maximum power. The delay through the carrier amplifier is also affected. More specifically, at full power, the carrier amplifier delay has been reduced to its normal level. Thus the delay of the overall Doherty amplifier has decreased with an increasing input signal.

The varying delay through the carrier amplifier 20, however, causes some undesirable characteristics in the operation of the Doherty amplifier design. Specifically, the variation in the delay of the Doherty amplifier resulting from the variation in the input signal level results in changes in the amplifier's AM-to-PM (AM/PM) characteristic as the frequency of the operation is changed. The AM/PM characteristic of an amplifier is the change in the amplifier's phase shift as the input power to the amplifier is changed. While amplifiers utilizing common Class-AB operation have relatively small changes in the AM/PM over a given frequency range, Doherty amplifiers have a significantly larger change in the AM/PM. A typical Doherty amplifier has the characteristic as generally depicted in FIG. 2.

The AM/PM variation causes distortion issues. Specifically, these changes in the AM/PM characteristic cause the inter-modulation (IM) distortion of an optimized Doherty amplifier to degrade as the frequency of operation increasingly deviates from the center frequency of the operational band. This may cause an amplifier to fail a specification at the band edge, or result in a decreased margin to a specification for a Doherty amplifier.

Such a variation in the IM distortion causes other problems as well. In some applications, it is desirable to improve an amplifier's linearity through the use of pre-distortion. Implementation of the pre-distorter in an amplifier is made more complicated by the presence of changing AM/PM distortion, which is a form of memory. While pre-distorters can be implemented to correct for this form of memory, minimizing the amount of memory usually results in a more effective system, and therefore, is a desired solution.

Accordingly, it is desirable to improve the amplification schemes for RF applications associated with high peak-to-average signals ratio. It is also further desirable to address the drawbacks in the prior art by providing efficient and linear amplification with minimal distortion, during both low power and high power peak requirements. It is further desirable to minimize the effects of frequency variations on RF amplification schemes for high peak-to-average signal ratios. These, and other objectives, are addressed by the invention described and claimed herein.

BRIEF DESCRIPTION OF FIGURES

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

The objectives noted above, as well as other objectives, are addressed by the present invention, which provides a high efficiency amplifier architecture for efficiently handling high peak-to-average signal ratio applications while maintaining desirable AM/PM characteristics. The amplifier does so, without complicated and expensive electronics. Furthermore, the amplifier is viable with linearization schemes, including digital, analog, and hybrid pre-distortion, Feed Forward, and Cross Cancellation. Furthermore, it is compatible with drain bias modulation schemes.

The present invention provides a new, simple and relatively inexpensive device and method for a high efficiency power amplifier utilizing a signal delay scheme applicable to a Doherty amplifier design. The invention decreases the change or variation in the AM/PM characteristic as the input signal frequency is changed. While not completely eliminating the AM/PM change, it does provide a measurable improvement that allows Doherty amplification to be used in situations where it had previously been excluded. A brief explanation of a classic Doherty circuit operation, which would be known to a person of ordinary skill in the art, is useful for understanding the operation of the present invention.

Figure 1:
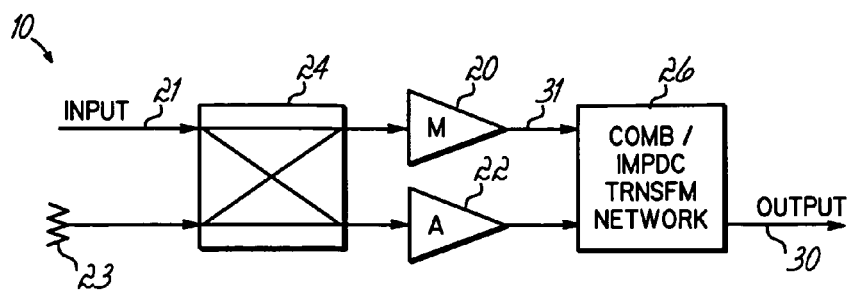
FIG. 1 is a block diagram of a Doherty amplifier design.

Generally, a simple Doherty circuit 10, as shown in FIG. 1, will combine the outputs of a main amplifier 20, such as a carrier amplifier, and an auxiliary amplifier 22, such as a peaking amplifier. An input signal 21 to the amplifiers 20, 22 is split by an appropriate signal splitting circuit 24, such as a hybrid coupler circuit. The other input port of the hybrid coupler may be terminated with an appropriate impedance 23. The split input signals are directed to the carrier amplifier 20 and the peaking amplifier 22. The output of the carrier amplifier 20 is combined through a signal combining network, such as a combiner/impedance transforming network 26, with the output of the peaking amplifier 22, and the combined outputs are present at the output 30 of network 26. Under a low input signal level drive condition, the peaking amplifier 22 is turned OFF and its high output impedance is assumed to not significantly load the output circuit. When the input signal 21 drive level is increased to where the carrier amplifier 20 reaches saturation, the peaking amplifier 22 is allowed to turn ON, thus contributing current to the output network 26. The additional current causes the network 26 output to increase which, in turn, results in a decreasing load impedance at the carrier amplifier's output 31. As the input signal level continues to rise, the carrier amplifier 20 is kept in a voltage-saturated condition, but the power level of that saturated condition increases due to the decreasing load impedance. At the same time, the peaking amplifier is contributing power to the output of the amplifier. At the highest input drive level, both the carrier and peaking amplifiers have their designated nominal load impedance, at their respective outputs, and are delivering their maximum rated power to the load that is coupled to output 30.

Figure 2:
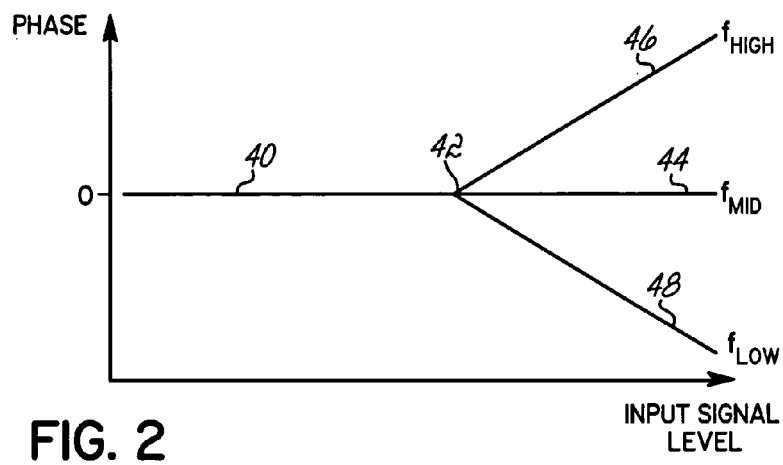
FIG. 2 is a typical AM/PM characteristic for a Doherty amplifier design.

FIG. 2 illustrates an AM/PM characteristic for a typical Doherty amplifier. While the characteristic displays a relatively constant phase with an increasing input signal level, as indicated at line 40, at a specific transition point 42, the AM/PM characteristic deviates. Specifically, the AM/PM characteristic is dependent upon the deviation of the frequency of operation of the amplifier from the center frequency of the operational band for that amplifier. For example, an amplifier would generally be operated within an operational frequency band. That is, for the Doherty amplifier design illustrated in FIG. 1, each of the main amplifier 20 and auxiliary amplifier 22 are operated at a specific operational frequency band. Such a frequency band would have what is generally considered a center of frequency. In the present invention, reference to an operational frequency band is made, but it is not limited to any specific band. Furthermore, when a center frequency is referred to, it is not limited to a specific or precise center frequency, but generally indicates a frequency approximately at the center of defined operational frequency band.

Returning now to the graph of FIG. 2, past the transition point 42, the AM/PM characteristic is affected by the frequency of operation of the amplifiers with respect to the deviation of that signal frequency from a center frequency. That is, it is affected by the frequency of the input signal as it deviates from the center frequency of the operational frequency band. Generally, for those frequencies proximate the center of the band ($f_{MID}$), as illustrated by the portion of the graph in FIG. 2 indicated by reference numeral 44, the signal phase remains generally consistent with an ever-increasing input signal level. However, there is a change in the AM/PM characteristic as the frequency of operation deviates from the center frequency. Specifically, the portion of the graph indicated by reference numeral 46 illustrates the AM/PM characteristic for those high frequencies $f_{HIGH}$ that deviate from the middle of the band $f_{MID}$. Similarly, as illustrated by the portion of the graph indicated by reference numeral 48, the AM/PM characteristic also changes as the frequency deviates to a frequency $f_{LOW}$ that is below the middle range $f_{MID}$ of frequencies for the operational frequency band.

The variations or changes in the AM/PM characteristic cause IM distortion in an optimized Doherty amplifier. Such IM distortion degrades as the frequency of operation increasingly deviates from the center frequency of the operational frequency band. As illustrated in FIG. 2, significant changes in the AM/PM characteristic may cause significant IM distortion. This, in turn, may cause an amplifier to fail a specification out at the band edge, far from the center frequency. Furthermore, there may be a decreased margin with respect to an operational specification for the amplifier due to such IM distortion from the varying AM/PM characteristic.

Figure 3:
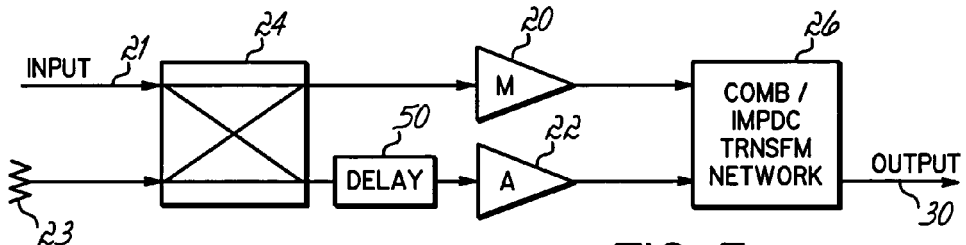
FIG. 3 is a block diagram of an amplifier system in accordance with one aspect of the present invention.

In accordance with one embodiment of the present invention, as illustrated in FIG. 3, the AM/PM variation, as a function of the input frequency in the Doherty amplifier, is reduced through the addition of a delay in the path of the auxiliary amplifier, or peaking amplifier. Referring to FIG. 3, where like reference numerals as in FIG. 1 are used, a delay element 50 is coupled in the path of the auxiliary amplifier. In the embodiment illustrated in FIG. 3, the delay element 50 is coupled to the input of the auxiliary amplifier 22 to introduce a delay to that input and ultimately to introduce a delay to the auxiliary amplifier path prior to the combiner/impedance transforming network 26. The delay introduced by the delay element 50 has a value based on several criteria in accordance with the principles of the invention, and as discussed below.

Figure 4:
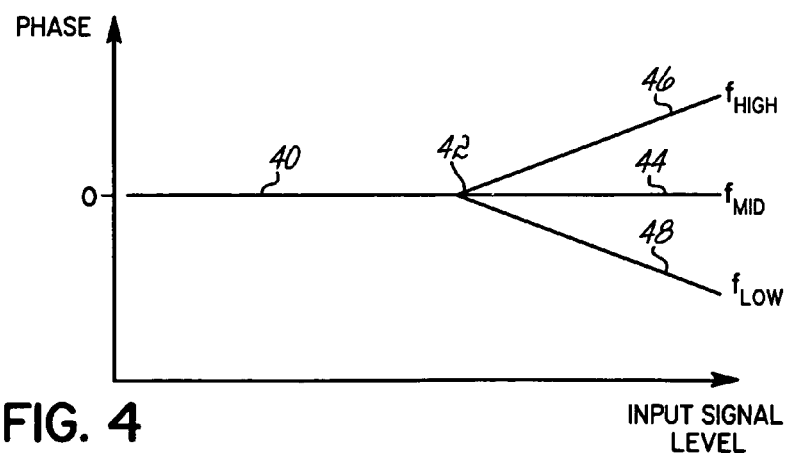
FIG. 4 is an AM/PM characteristic for the invention.

As the signal level of the input signal 21 increases, the increasing delay that occurs through the main amplifier 20, or carrier amplifier, as discussed above, is compensated by the delay element 50. More specifically, the decreasing delay through the main amplifier 20 is somewhat compensated by the addition at the output 30 of a signal from the auxiliary amplifier that has been delayed by the specific delay element selected 50. This net effect is a reduction in the amount of variation in the amplifier delay as the level of the input signal 21 is increased. The net effect of a reduction in the amount of change in the amplifier delay as the level of the input signal is increased results in less of a variation in the AM/PM characteristic as a function of the change in the input frequency of the amplifier. This, in turn, results in a reduction in the IM distortion, as the frequency of the amplifier operation deviates from the center frequency of the operational frequency band for the amplifier. That is, there is less of an excursion of the signal phase from zero at various low and high frequency extremes associated with the operational frequency band. FIG. 4 illustrates an AM/PM characteristic for a Doherty amplifier system utilizing the present invention. FIG. 4 shows the reduced deviation of the AM/PM characteristic with increased input signal level as the frequency deviates from the center frequency (See, e.g., FIG. 2).

The additional delay in the path of the auxiliary amplifier may be implemented in several ways. For example, the delay element 50 may include a co-axial cable element, or may include micro-strip or strip-line transmission line elements or other suitable physical implementations of an RF delay element. Alternatively, commercially available surface mount delay lines might be utilized in the auxiliary amplifier path. At some point, dependent upon the bandwidth of interest and the magnitude of delay being compensated, further increases in the auxiliary amplifier path delay will result in degraded power performance at the amplifier band edges. The optimum delay is selected considering the system requirements and in accordance with the principles of the present invention. The delay presented by the delay element 50 cannot be just any delay, but rather will depend on the desired operation of the amplifier and the amount of reduction in the AM/PM characteristic that is desirable. For example, while an increase in the delay in accordance with the principles of the invention will generally improve the AM/PM characteristic, a delay that is too large will narrow the bandwidth. Typically, the bandwidth narrowing will cause the efficiency improvement, normally provided by the Doherty topology, to suffer at the band edges. Therefore, the desire for AM/PM improvement and bandwidth performance must be determined.

In accordance with one aspect of the present invention, several criteria are utilized for the delay element in order to determine the proper delay for the particular Doherty amplifier design. The amount of delay that should be added for enhanced performance will depend upon the specifics of the particular Doherty amplifier design. More specifically, in the present invention, the delay introduced by the inventive delay element will depend upon how much the delay through the main amplifier's output matching network changes with the changing additions of the load on its output.

In accordance with the invention, this delay change is determined by measuring the delay through the entire Doherty amplifier under two conditions. The first condition is when the output is driven to the rated PEP of the Doherty amplifier. The second condition is where the output is driven to a level significantly below (at least 10 dB), the rated peak power or PEP of the Doherty amplifier. Generally, the delay measured under the first condition will be less than the delay measured under the second condition, below peak power. This difference in delay is designated as ΔT. In one aspect, the delay to be added to the auxiliary amplifier path through the delay element 50, designated as $T_A$ will mostly be in the following range:

$$T_A = \text{around } 2\Delta T - \text{around } 4\Delta T \qquad \text{EQUATION 1}$$

However, a delay generally in the range of $T_A$=around 1ΔT–around 6ΔT may also be suitable.

In accordance with another criteria for the delay provided by delay element 50 of the invention, the $T_A$ has an additional restriction. That is, $T_A$ should generally be approximately an integer multiple of a wavelength at a frequency within the operational frequency band. More preferably, the delay should generally be an integer multiple of a wavelength at the center frequency within the operational band for the amplifier. As readily understood by a person of ordinary skill in the art, a delay indicated as being an integer multiple of a wavelength refers to a delay that is an integer multiple of the delay through a one (1) wavelength transmission line. Such delay is expressed in units of time. This is equivalent to:

$$T_A \text{ (nsec)} = n/f \text{ (GHz)}, n=1, 2, 3 \qquad \text{EQUATION 2}$$

An example best illustrates the desired delay from delay element 50. Assume, for example, the measured difference in delay, ΔT, for the various output conditions described above was approximately 0.8 nsec, at a center frequency of around 2 GHz. From Equation 1 above, we can pick one of the values of Equation 2 that is also within the range set forth in Equation 1. From Equation 1, $T_A$=1.6–3.2 nsec (or possibly 0.8–4.8 nsec). From Equation 2, $T_A$=0.5, 1.0, 1.5, 2.0, 2.5, 3.0, 3.5, 4.0 . . . nsec. Therefore, the added delay meeting both these criteria would then be a $T_A$ of 2.0, 2.5, or 3.0 nsec. From these choices, the best choice would be determined experimentally. For example, the various AM/PM characteristics as in FIG. 4 might be determined to see which $T_A$ value yields the greatest reduction in the AM/PM variation as a function of the operational frequency. Typically, increasing the delay improves the AM/PM characteristic. However, as noted above, if the delay is too large, then the bandwidth is undesirably narrowed, and gain and efficiency may suffer out at the band edges. A decision is made as to which criteria, that is, improvement in AM/PM or bandwidth considerations, are more desirable.

Figure 5:
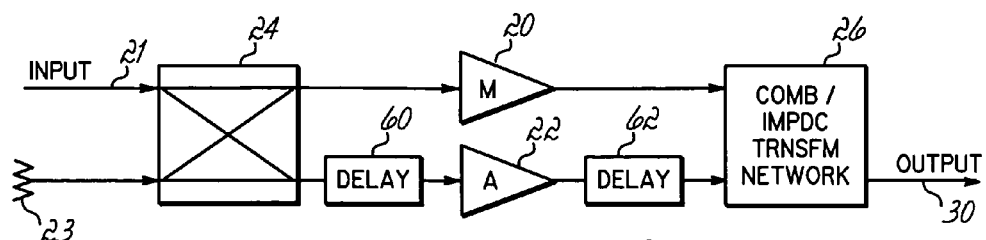
FIG. 5 is a block diagram of another embodiment of an amplifier system in accordance with the present invention.

Although the embodiment illustrated in FIG. 3 shows a delay element 50 positioned at the input to the auxiliary amplifier 22, the delay, according to the criteria of the invention, might also be placed elsewhere within the auxiliary amplifier path. FIG. 5 illustrates an alternative embodiment. A delay element 60 may be incorporated at the input to the auxiliary amplifier, while another delay element 62 might be incorporated at the output. The total delay provided in the auxiliary amplifier path between elements 60 and 62 is determined according to the criteria set forth above.

Figure 6:
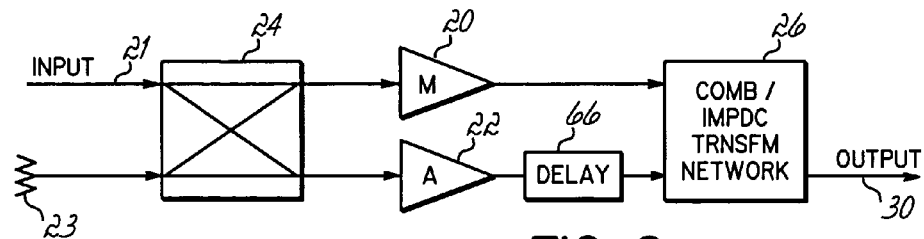
FIG. 6 is a block diagram of another embodiment of an amplifier system in accordance with the present invention.

In still another alterative embodiment, as illustrated in FIG. 6, all the delay may be placed at the auxiliary amplifier output, such as by using a delay element 66.

It should be noted that although $T_A$, or a portion of $T_A$, may be placed at the auxiliary amplifier output, it is suspected that doing so will result in decreased bandwidth, relative to the case where all the $T_A$ is placed at the auxiliary amplifier input. Accordingly, while the alternative embodiments shown in FIGS. 5 and 6 might be utilized, the embodiment of FIG. 4 may be most preferable with respect to the desired bandwidth characteristics.

In accordance with another aspect of the present invention, the $T_A$ added to the Doherty amplifier, such as through a delay element 50, is added to any inherent delay that already appears at the auxiliary amplifier input. For example, depending on the splitting/combining scheme chosen for the particular Doherty amplifier, there may be an inherent short delay (quarter wavelength, for example) at the input of the auxiliary or peaking amplifier, to provide the proper phasing relationship outputs to achieve optimum power combining. In such a situation and in accordance with the principles of the present invention, the $T_A$ should be added to this already existing delay at the input to the auxiliary amplifier.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. An amplifier comprising:
a main amplifier circuit having an input and output;
at least one auxiliary amplifier circuit having an input and output, the auxiliary amplifier circuit being selectively operable to operate in combination with the main amplifier circuit;
a signal combining network coupled with outputs of the main amplifier circuit and auxiliary amplifier circuit and operable to combine amplifier circuit output signals at an output port;
the main and auxiliary amplifier circuits operating in an operational frequency band;
a delay element coupled to the input of each auxiliary amplifier to introduce a delay to that input, the delay element configured for introducing a delay prior to the signal combining network that is approximately an integer multiple of a wavelength at a frequency within the operational frequency band.

2. The amplifier of claim 1 wherein the operational frequency band has a center frequency, the delay element configured for introducing a delay that is approximately an integer multiple of a wavelength at the center frequency within the operational frequency band.

3. The amplifier of claim 1 wherein the delay is reflective of a ΔT, the ΔT measured as a delay difference between a delay through the amplifier when the output of the amplifier is driven to a peak power and a delay through the amplifier when the output of the amplifier is driven to a level below the peak power.

4. The amplifier of claim 3 wherein the delay is in the range of around 1 ΔT to around 6 ΔT.

5. The amplifier of claim 1 wherein the auxiliary amplifier has an inherent delay at its input, the delay of the delay element being added to the inherent delay.

6. The amplifier of claim 1 wherein the delay element is configured for maintaining a desired bandwidth.

7. The amplifier of claim 1 wherein the delay element includes an element incorporating at least one of a coax cable, a micro-strip transmission line, a strip-line transmission line or a surface mount element.

8. An amplifier comprising:
a main amplifier circuit having an input and output;
at least one auxiliary amplifier circuit having an input and output, the auxiliary amplifier circuit being selectively operable to operate in combination with the main amplifier circuit;
a signal combining network coupled with outputs of the main amplifier circuit and auxiliary amplifier circuit and operable to combine amplifier circuit output signals at an output port;
the main and auxiliary amplifier circuits operating in an operational frequency band;
a delay element coupled with each auxiliary amplifier to introduce a delay to that amplifier, the delay element configured for introducing a delay prior to the signal combining network that is approximately an integer multiple of a wavelength at a frequency within the operational frequency band.

9. The amplifier of claim 8 wherein the delay element is coupled to the output of the auxiliary amplifier.

10. The amplifier of claim 8 wherein the delay element includes a component coupled to the input of the auxiliary amplifier and a component coupled to the output of the auxiliary amplifier.

11. The amplifier of claim 8 wherein the operational frequency band has a center frequency, the delay element configured for introducing a delay that is approximately an integer multiple of a wavelength at the center frequency within the operational frequency band.

12. The amplifier of claim 8 wherein the delay is reflective of a ΔT, the ΔT measured as a delay difference between a delay through the amplifier when the output of the amplifier is driven to a peak power and a delay through the amplifier when the output of the amplifier is driven to a level below the peak power.

13. The amplifier of claim 12 wherein the delay is in the range of around 1 ΔT to around 6 ΔT.

14. The amplifier of claim 8 wherein the auxiliary amplifier has an inherent delay at its input, the delay of the delay element being added to the inherent delay.

15. The amplifier of claim 8 wherein the delay element is configured for maintaining a desired bandwidth.

16. The amplifier of claim 8 wherein the delay element includes an element incorporating at least one of a coax cable, a micro-strip transmission line, a strip-line transmission line or a surface mount element.

17. A method of amplifying a signal comprising:
directing an input signal to a main amplifier circuit and at least one auxiliary amplifier circuit to generate respective outputs from the amplifier circuits, the auxiliary amplifier circuit being selectively operable to operate in combination with the main amplifier circuit;
combining the outputs of the main amplifier circuit and auxiliary amplifier circuit at an output port;
operating the main and auxiliary amplifier circuits in an operational frequency band;
introducing a delay to each auxiliary amplifier to delay the output of the auxiliary amplifier circuit prior to combining the outputs of the main and auxiliary amplifier circuits, the delay being approximately an integer multiple of a wavelength at a frequency within the operational frequency band.

18. The method of claim 17 further comprising introducing the delay at an input of the auxiliary amplifier.

19. The method of claim 17 further comprising introducing the delay at an output of the auxiliary amplifier.

20. The method of 17 further comprising introducing a portion of the delay at an input of the auxiliary amplifier and a portion of the delay at an output of the auxiliary amplifier.

21. The method of claim 17 wherein the operational frequency band has a center frequency, the method further comprising introducing a delay that is approximately an integer multiple of a wavelength at the center frequency within the operational frequency band.

22. The method of claim 17 further comprising introducing a delay that is reflective of a $\Delta T$, the $\Delta T$ being measured as a delay difference between a delay through the amplifier when the output of the amplifier is driven to a peak power and a delay through the amplifier when the output of the amplifier is driven to a level below the peak power.

23. The method of claim 22 wherein the delay is in the range of around 1 $\Delta T$ to around 6 $\Delta T$.

24. The method of claim 17 wherein the auxiliary amplifier has an inherent delay, and further comprising introducing the delay in addition to the inherent delay.

25. The method of claim 17 wherein the delay element is configured for maintaining a desired bandwidth.

* * * * *